(12) United States Patent
Wada

(10) Patent No.: US 6,521,826 B2
(45) Date of Patent: Feb. 18, 2003

(54) THIN FILM SOLAR CELL AND FABRICATION METHOD THEREFOR

(75) Inventor: Kenji Wada, Takarazuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/723,277

(22) Filed: Nov. 29, 2000

(65) Prior Publication Data

US 2001/0025649 A1 Oct. 4, 2001

(30) Foreign Application Priority Data

Nov. 30, 1999 (JP) .......................................... 11-340283

(51) Int. Cl.$^7$ ...................... H01L 31/036; H01L 31/075
(52) U.S. Cl. ...................... 136/255; 136/258; 136/261; 257/64; 257/458; 438/97; 438/57; 427/585; 427/588
(58) Field of Search ...................... 136/255, 258, 136/261; 257/64, 458; 438/97, 57; 427/585, 588

(56) References Cited

U.S. PATENT DOCUMENTS 6,211,454 B1 * 4/2001 Sano .......................... 136/258
6,465,727 B2 * 10/2002 Maruyama et al. .......... 136/256

FOREIGN PATENT DOCUMENTS

| JP | 1-253282 A | 10/1989 |
|----|------------|---------|
| JP | 2846639 B2 | 10/1998 |
| JP | 11-87742 A | 3/1999 |
| JP | 11-135814 A | 5/1999 |
| JP | 11-135818 A | 5/1999 |
| JP | 11-145498 A | 5/1999 |
| JP | 11-145498 A * | 5/1999 |
| JP | 11-274530 A * | 10/1999 |

OTHER PUBLICATIONS

Fluckiger et al, "Preparation of Undoped and Doped Microcrystalline Silicon ($\mu$c–Si:H) by VHF–GD for P–I–N Solar Cells," 23rd IEEE Photovoltaic Specialists Conference, pp. 839–844, (May 1993).*

* cited by examiner

Primary Examiner—Alan Diamond
(74) Attorney, Agent, or Firm—Nixon & Vanderhye P.C.

(57) ABSTRACT

An n-type polysilicon thin film, an intrinsic polysilicon thin film and a p-type polysilicon thin film are formed on a transparent conductive film of a glass substrate by the plasma enhanced CVD method at a plasma excitation frequency of 81.36 MHz so as to obtain a photoelectric conversion layer. The n-type polysilicon thin film and the intrinsic polysilicon thin film are then formed so that the crystallization ratio of the n-doped layer located on the incident light side becomes equal to or greater than the crystallization ratio of the intrinsic layer. Thus, a thin film solar cell having an appropriate structure of a junction interface between the n-layer and the intrinsic layer is obtained.

7 Claims, 4 Drawing Sheets

*Fig.7*

| CONDITION | PHOTOVOLTAIC CONVERSION EFFICIENCY [%] | OPEN CIRCUIT VOLTAGE [V] | SHORTCIRCUIT CURRENT [mA/cm$^2$] | FILL FACTOR |
|---|---|---|---|---|
| 1 | 8.05 | 0.515 | 22.20 | 0.704 |
| 2 | 6.18 | 0.450 | 22.45 | 0.612 |

THIN FILM SOLAR CELL AND FABRICATION METHOD THEREFOR

BACKGROUND OF THE INVENTION

The present invention relates to a thin film solar cell that has satisfactory photovoltaic conversion efficiency and a method for fabricating the thin solar cell.

The solar cell is attracting a great deal of attention as an alternative energy source substitute for fossil fuels such as petroleum, which are considered to be supplied less in future and have the problem of carbon dioxide emission as a cause of the global warming phenomenon.

The solar cell employs a pn junction in its photoelectric conversion layer for converting a light energy into an electric power, and silicon is generally most frequently employed as a semiconductor for constituting the pn junction. It is preferable to employ single crystal silicon in terms of photovoltaic conversion efficiency. However, the single crystal silicon has problems of material supply, areal increase, cost reduction and so on.

On the other hand, as a material advantageous for the achievement of areal increase and cost reduction, there is amorphous silicon. A thin film solar cell that employs this amorphous silicon as a photoelectric conversion layer has been put into practical use, however, its photovoltaic conversion efficiency is inferior to that of the single crystal silicon solar cell. Furthermore, the amorphous silicon causes a phenomenon called the Staebler-Wronski effect that the defect density in a film increases as light is applied, and therefore, the amorphous silicon solar cell is accompanied by the problem of deterioration with a lapse of time in terms of photovoltaic conversion efficiency.

Accordingly, in recent years, there have been conducted researches on the applications of polysilicon to the photoelectric conversion layer in order to provide a stabilized high photovoltaic conversion efficiency on the same level as that of the single crystal silicon solar cell and the areal increase and cost reduction on the same level as that of the amorphous silicon solar cell. In particular, a thin film polysilicon solar cell in which a thin film polysilicon is formed by means of a thin film forming technique by the chemical vapor deposition (CVD) method similar to that of the amorphous silicon is attracting a great deal of attention.

However, the current photovoltaic conversion efficiency of the thin film polysilicon solar cell fabricated by this method is merely on the same level as the photovoltaic conversion efficiency of the amorphous silicon solar cell. Several factors can be considered with regard to the low photovoltaic conversion efficiency, and one great factor is ascribed to the fact that the junction state at the interface between a doped layer and an intrinsic photoelectric conversion layer is not appropriately formed.

In the case of the aforementioned amorphous silicon solar cell, the state of the interface between a p-layer located on the incident light side and the intrinsic photoelectric conversion layer is particularly important. As a method for giving solution, the Japanese patent No. 2,846,639 discloses a method for providing a p/i interface layer in which carbon concentration is gradually varied between the p-layer constructed of a-SiC (amorphous silicon carbide) and the intrinsic photoelectric conversion layer constructed of a-Si (amorphous silicon). Japanese Patent Laid-Open Publication No. HEI 11-135814 discloses a method for setting a film forming rate of the intrinsic layer that has a thickness of several tens of nanometers and is put in contact with the p-layer slower than the film forming rate of the intrinsic layer to be subsequently formed. That is, these methods are the methods of providing an intermediate layer for improving the state of junction between the p-layer and the intrinsic layer.

Of course, applying the method of providing an intermediate layer to the thin film polysilicon solar cell contributes to the improvement of photovoltaic conversion efficiency. For example, Japanese Patent Laid-Open Publication No. HEI 11-135818 discloses a solar cell provided with a microcrystalline buffer layer that is formed by the plasma enhanced CVD method and provided between a p-type hydrogenated microcrystalline silicon layer and an intrinsic hydrogenated microcrystalline silicon layer. Damage of the p/i interface can be reduced by virtue of the existence of this microcrystalline buffer layer, and a open-circuit voltage and a fill factor value are improved to increase the photovoltaic conversion efficiency from 0.93% to 1.68%.

Generally, in the case of a polysilicon formed by the vapor deposition method such as the plasma enhanced CVD method, there is formed a phase of mixture including an amorphous component instead of the formation of a thin film that is completely made only of a crystal component. Then, in the amorphous component and a portion where the crystal component and the amorphous component adjoin each other, the bond state of silicon atoms is significantly disordered, and there is existing a great many uncombined hands, or the so-called dangling bond portions. The dangling bond forms a defect level in the forbidden band to consequently deteriorate the electric characteristics. Therefore, in the case of the thin film polysilicon solar cell, it is required to perform device design taking the state of existence of the crystal component and the amorphous component into due consideration. However, the method disclosed in Japanese Patent Laid-Open Publication No. HEI 11-135818 is no more than a method similar to the method for the solution of the aforementioned amorphous solar cell and is not regarded as a method that takes the existence of the crystal component into due consideration.

As a solar cell device design that takes the existence of the crystal component into consideration and has been disclosed so far, there are the methods disclosed in Japanese Patent Laid-Open Publication No. HEI 11-87742 and Japanese Patent Laid-Open Publication No. HEI 11-145498. The methods disclosed in these prior art reference documents are to obtain a photoelectric conversion layer that has a high crystallization ratio, a large crystal grain size and a firm crystal orientation property by providing an intrinsic amorphous silicon layer as a foundation layer of the intrinsic photoelectric conversion layer that includes a crystalline structure, controlling the crystallization ratio of the doped layer that includes a crystalline structure to be the foundation layer or taking similar measures. The structural characteristics of the thin film solar cells fabricated by these methods are as follows. In the case of the method disclosed in Japanese Patent Laid-Open Publication No. HEI 11-87742, an amorphous silicon layer is inserted between the doped layer that includes a crystalline structure and the intrinsic photoelectric conversion layer. In the case of the method disclosed in Japanese Patent Laid-Open Publication No. HEI 11-145498, the crystallization ratio of the doped layer, or the foundation layer of the photoelectric conversion layer is equal to or smaller than the crystallization ratio of the intrinsic photoelectric conversion layer.

However, the solar cell devices that take the existence of the crystal component into consideration and are disclosed in Japanese Patent Laid-Open Publication No. HEI 11-87742 and Japanese Patent Laid-Open Publication No. HEI 11-145498 have the problems as follows.

That is, the structures of the prior art solar cell devices are considered to be inappropriate for solar cells. The problems reside in the existence of a large amount of amorphous components in the doped layer itself or between the doped layer and the intrinsic photoelectric conversion layer. The problems owned by these structures are now described in detail below.

In a pin type thin film polysilicon solar cell constructed by successively stacking a p-type doped layer, an intrinsic photoelectric conversion layer and an n-type doped layer, separation of a pair of carriers (electron and hole) is performed by an internal electric field generated in the vicinity of a junction interface between the p-layer and the i-layer (intrinsic layer) or between the n-layer and the i-layer. If a large amount of amorphous components exists in the vicinity of the junction interface, then a large amount of defect levels exist due to the existence of a great many dangling bond portions in the amorphous component and the portion where the crystal component and the amorphous component adjoin each other, as described hereinabove. Consequently, the internal electric field is weakened to lower the open-circuit voltage. For example, considering the flow of carriers from the intrinsic layer to the n-layer, electrons flow from the intrinsic layer into the n-layer in the vicinity of the junction interface. However, in the structure where a large amount of amorphous components exists in the doped layer itself or between the doped layer and the intrinsic photo-electric conversion layer, a series resistance increases in a direction in which electrons flow, and consequently the fill factor is reduced. It is a matter of course that a similar phenomenon results in the junction interface between the p-layer and the intrinsic layer.

Due to the characteristic of the amorphous component having a great optical absorption coefficient on the shorter wavelength side, there is the problem that a considerable amount of incident light is disadvantageously absorbed in the doped layer itself when the doped layer includes a large amount of amorphous components and contributes nothing to photovoltaic conversion.

Conversely speaking, by designing the crystallization ratio of the doped layer equal to or greater than the crystallization ratio of the intrinsic layer, the existence of a large amount of amorphous components in the vicinity of the junction interface can be avoided. In addition, photoabsorption in the doped layer itself is also reduced by the increase in the crystallization ratio of the doped layer itself, and this allows a thin film solar cell having a high photovoltaic conversion efficiency to be fabricated.

With regard to the pin type thin film polysilicon solar cell, if a solar cell is constructed of an intrinsic layer and a doped layer determined by the single film characteristic values obtained by the normally used characteristic evaluation method such as electric conductivity measurement and light transmittance and reflectance measurement, then the characteristics of the solar cell are often inferior to the values expected by the aforementioned single film characteristic values. This is ascribed to the fact that the polysilicon thin film formed by the vapor deposition method such as the plasma enhanced CVD method often has an uneven microscopic structure in the direction of thickness. That is, in the pin type thin film polysilicon solar cell, the doped layer is usually formed so as to have a thickness of not greater than several tens of nanometers for the purposes of reducing the photoabsorption in the doped layer itself that contributes nothing to photoelectric conversion and reducing the series resistance component of the solar cell. However, in general, the formation conditions of the intrinsic layer and the doped layer are determined by evaluating the single film characteristics of each of the layers having about several hundreds to several thousands of nanometers. The film thickness of about several hundreds to several thousands of nanometers is the film thickness necessary for securing the reliability of the measurement values of a characteristic evaluation apparatus by a variety of optical methods or electrical methods. However, the thus-obtained characteristic values are no more than the information averaged throughout the entire film thickness of about several hundreds to several thousands of nanometers. Therefore, it is impossible to correctly estimate the state of the junction interface between the doped layer and the intrinsic layer, which have microscopic structures nonuniform in the direction of thickness. Accordingly, it is impossible to obtain solar cell characteristics on the same level as those expected by the single film characteristics when the layers are formed on the basis of the single film characteristics. Therefore, it is important to optimally design the structure of the junction interface between the doped layer and the intrinsic layer by using an evaluation method capable of correctly grasping a change in the microscopic structure in the direction of thickness of the doped layer and the intrinsic layer.

SUMMARY OF THE INVENTION

Accordingly, an object of the present invention is to provide a thin film solar cell that has an appropriate junction interface structure in which the crystallization ratio of a doped layer is equal to or greater than the crystallization ratio of an intrinsic layer as well as a method for fabricating the solar cell.

In order to achieve the aforementioned object, a first inventive aspect of the present invention provides a thin film solar cell wherein a p-type doped layer, an intrinsic photoelectric conversion layer and an n-type doped layer are stacked in this order or in order of the n-type doped layer, the intrinsic photoelectric conversion layer and the p-type doped layer and at least the doped layer formed firstly and the intrinsic photoelectric conversion layer formed secondly are silicon thin films including crystal components, the firstly formed doped layer having a crystallization ratio being equal to or greater than a crystallization ratio of the secondly formed intrinsic photoelectric conversion layer.

According to the above construction, the crystallization ratio of the firstly formed doped layer is equal to or greater than the crystallization ratio of the secondly formed intrinsic photoelectric conversion layer. Therefore, the amorphous silicon component does not increase in a direction from the secondly formed intrinsic photoelectric conversion layer to the firstly formed doped layer, and the structure of the junction interface between the doped layer and the intrinsic layer is optimized to allow a high photovoltaic convers-on efficiency to be obtained.

In this case, the aforementioned "silicon thin film including the crystal component" means a silicon thin film in which the existence of a spectrum of about 520 $cm^{-1}$ corresponding to the crystal silicon is confirmed as the result of evaluation by the angle-lapping Raman scattering spectrometry method described in detail later.

In a variation of the first aspect of the present invention, the firstly formed doped layer is formed on a translucent substrate stacked with a transparent conductive film, and light enters from the firstly formed doped layer.

According to the above construction, light enters from the firstly formed doped layer having a high crystallization ratio and a small amount of amorphous silicon that causes a deterioration with a lapse of time of the photovoltaic conversion efficiency due to the aforementioned Staebler-Wronski effect, allowing a high photovoltaic conversion efficiency to be obtained.

A second aspect of the present invention provides a thin film solar cell wherein a p-type doped layer, an intrinsic photoelectric conversion layer and an n-type doped layer are stacked in this order or in order of the n-type doped layer, the intrinsic photoelectric conversion layer and the p-type doped layer and at least the intrinsic photoelectric conversion layer formed secondly and the doped layer formed thirdly are silicon thin films including crystal components, the thirdly formed doped layer having a crystallization ratio being equal to or greater than a crystallization ratio of the secondly formed intrinsic photoelectric conversion layer.

According to the above construction, the crystallization ratio of the thirdly formed doped layer is equal to or greater than the crystallization ratio of the secondly formed intrinsic photoelectric conversion layer. Therefore, the amorphous silicon component does not increase in a direction from the secondly formed intrinsic photoelectric conversion layer to the thirdly formed doped layer, and the structure of the junction interface between the doped layer and the intrinsic layer is optimized to allow a high photovoltaic conversion efficiency to be obtained.

In a variation of the second aspect of the present invention, light enters from the thirdly formed doped layer.

According to the above construction, light enters from the thirdly formed doped layer having a high crystallization ratio and a small amount of amorphous silicon that causes a deterioration with a lapse of time of the photovoltaic conversion efficiency, allowing a high photovoltaic conversion efficiency to be obtained.

A third aspect of the present invention further provides a thin film solar cell fabricating method for fabricating a thin film solar cell wherein a p-type doped layer, an intrinsic photoelectric conversion layer and an n-type doped layer are stacked in this order or in order of the n-type doped layer, the intrinsic photoelectric conversion layer and the p-type doped layer and at least the doped layer formed firstly and the intrinsic photoelectric conversion layer formed secondly are silicon thin films including crystal components, comprising the step of forming the first doped layer by a plasma enhanced chemical vapor deposition method using a VHF frequency band higher than a frequency of 13.56 MHz.

According to the above construction, the crystallization ratio of the first doped layer formed by the plasma enhanced CVD method using the VHF frequency band higher than the frequency of 13.56 MHz becomes equal to or greater than the crystallization ratio of the secondly formed intrinsic photoelectric conversion layer. Therefore, the amorphous silicon component does not increase in a direction from the secondly formed intrinsic photoelectric conversion layer to the firstly formed doped layer, and the structure of the junction interface between the doped layer and the intrinsic layer is optimized to allow a thin film solar cell having a high photovoltaic conversion efficiency to be formed.

A fourth aspect of the present invention provides a thin film solar cell fabricated by the thin film solar cell fabricating method set forth in the third aspect of the present invention.

According to the above construction, the crystallization ratio of the first doped layer formed by the plasma enhanced CVD method using the VHF frequency band higher than the frequency of 13.56 MHz becomes equal to or greater than the crystallization ratio of the secondly formed intrinsic photoeletric conversion layer. Therefore, the structure of the junction interface between the doped layer and the intrinsic layer is optimized to allow a high photovoltaic conversion efficiency to be obtained.

A fifth aspect of the present invention provides a thin film solar cell fabricating method for fabricating a thin film solar cell wherein a p-type doped layer, an intrinsic photoelectric conversion layer and an n-type doped layer are stacked in this order or in order of the n-type doped layer, the intrinsic photoelectric conversion layer and the p-type doped layer and at least the intrinsic photoelectric conversion layer formed secondly and the doped layer formed thirdly are silicon thin films including crystal components, comprising the step of forming the third doped layer by a plasma enhanced chemical vapor deposition method using a VHF frequency band higher than a frequency of 13.56 MHz.

According to the above construction, the crystallization ratio of the third doped layer formed by the plasma enhanced CVD method using the VHF frequency band higher than the frequency of 13.56 MHz becomes equal to or greater than the crystallization ratio of the secondly formed intrinsic photoelectric conversion layer. Therefore, the amorphous silicon component does not increase in a direction from the secondly formed intrinsic photoelectric conversion layer to the thirdly formed doped layer, and the structure of the junction interface between the doped layer and the intrinsic layer is optimized to allow a thin film solar cell having a high phctovoltaic conversion efficiency to be formed.

A sixth aspect of the present invention provides a thin film solar cell fabricated by the thin film solar cell fabricating method set forth in the fifth aspect of the present invention.

According to the above construction, the crystallization ratio of the third doped layer formed by the plasma enhanced CVD method using the VHF frequency band higher than the frequency of 13.56 MHz becomes equal to or greater than the crystallization ratio of the secondly formed intrinsic photoelectric conversion layer. Therefore, the structure of the junction interface between the doped layer and the intrinsic layer is optimized to allow a high photovoltaic conversion efficiency to be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a diagram showing the characteristic values of solar cells fabricated on different conditions.

DETAILED DESCRIPTION OF THE PREFERRED EMBODIMENTS

Figure 1:
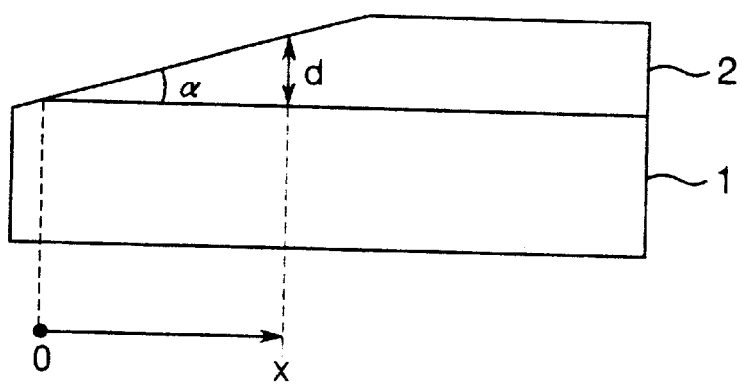
FIG. 1 is an explanatory view of a microscopic structure evaluation method for achieving a method for fabricating the thin film solar cell of the present invention.

The present invention will be described in detail below on the basis of the embodiments thereof shown in the drawings. As described hereinabove, in order to form a thin film solar cell having an appropriate junction interface structure, it is indispensable to establish an evaluation method capable of correctly grasping a change in the microscopic structure in the direction of thickness of the doped layer and the intrinsic layer. Accordingly, reference is first made to the evaluation method for clarifying the microscopic structures of the intrinsic layer and the doped layer of the present embodiment from its initial formation stage.

As a representative method capable of evaluating the microscopic structure of a thin film, there is a transmission electron microscopy. This transmission electron microscopy, which has a resolution on the atomic order, is a method appropriate for clarifying a very minute structure. However, there is a concern about a damage caused in a sample making process and much expense in time and effort required for producing the sample, and therefore, the method cannot be regarded as a simple method. Therefore, in order to speedily perform the work for optimizing the formation conditions by feeding back the evaluation results, it is required to make an evaluation by another simple method.

As a method capable of evaluating the microscopic structure of a thin film other than the transmission electron microscopy, there are optical methods such as a spectroscopic ellipsometry method and a Raman scattering spectroscopy method. These methods, which have the merits of their being nondestructive measurement, being measurable in the atmosphere and the like, can be regarded as methods appropriate for the purpose of speedily performing the work for optimizing the formation conditions by feeding back the evaluation results. However, due to the fact that light or particularly the visible light is used as a probe, the absorption depth reaches several hundreds of nanometers in the case of silicon, and the information to be obtained is no more than information averaged within the depth of several hundreds of nanometers. That is, the methods do not have the resolution capable of clarifying the microscopic structure within several Lens of nanometers in the initial thin film formation stage and are unable Lo achieve the purpose.

Accordingly, by subjecting samples to simple processing and using the Raman scattering spectroscopy method, or a simple evaluation method of the microscopic structure, a continuous change in the microscopic structure in the direction of thickness is enabled to be grasped. The conception of this evaluation method is now described in detail below.

FIG. 1 is an explanatory view of a microscopic structure evaluation method for achieving the method for fabricating the thin film solar cell of the present embodiment. According to this microscopic structure evaluation method, a polysilicon thin film 2 formed on a glass substrate 1 is subjected to mechanical lapping with a minute angle $\alpha$. In this stage, a slope is formed so as to include both a glass substrate 1 and a polysilicon thin film 2. Subsequently, by clarifying the shape of the slope by a surface roughness tester or the like, the minute angle $\alpha$ of inclination and an interface between the substrate and the thin film (a point at which an origin position x=0) are obtained. In this case, the angle a of inclination is obtained on the assumption that a portion that belongs to the polysilicon thin film 2 and has undergone no lapping process is parallel to the glass substrate 1. The origin position can be obtained from the phenomenon that a difference in angle of inclination clearly appears in the position of the interface between the substrate and the thin film due to a difference in hardness between the polysilicon thin film 2 and the glass substrate 1.

If these values are obtained, then a film thickness d in a measurement position x can be obtained by the equation: $d = x \times \tan\alpha$. Accordingly, by putting the Raman scattering spectroscopy method into practice while successively changing the measurement position x in the direction of slope formation, the information of the microscopic structure with respect to the continuous change in film thickness is obtained. It is to be noted that this microscopic structure evaluation method is hereinafter referred to as an "angle-lapping Raman scattering spectrometry method".

The angle-lapping Raman scattering spectrometry method has been put into practice for the purpose of clarifying the change in the microscopic structure in the direction of thickness of a thin film as in the present case. For example, according to the technical paper (Journal of Applied Physics, Vol. 64, 1988) by S. J. Chang et al., this technique is applied to the evaluation of stress of a $Ge_xSi_{1-x}$ film formed on a single crystal silicon wafer.

In the present embodiment, attention is paid to the ratio between the crystal component and the amorphous component, i.e., the crystallization ratio with regard to the microscopic structure. Accordingly, a height Ic of a Raman scattering spectrum peak of about 520 $cm^{-1}$ corresponding to the crystal silicon and a height Ia of a Raman scattering spectrum peak of about 480 $cm^{-1}$ corresponding to the amorphous silicon are obtained by the aforementioned angle-lapping Raman scattering spectrometry method. Then, the ratio $Ic/(Ic+Ia)$ of the crystal silicon peak is used as an evaluation index of the crystallization ratio. It is to be noted that the value of $Ic/(Ic+Ia)$ does not directly represent the volume fraction of the crystal component and is nothing but the evaluation index of the crystallization ratio to the utmost.

Figure 2:
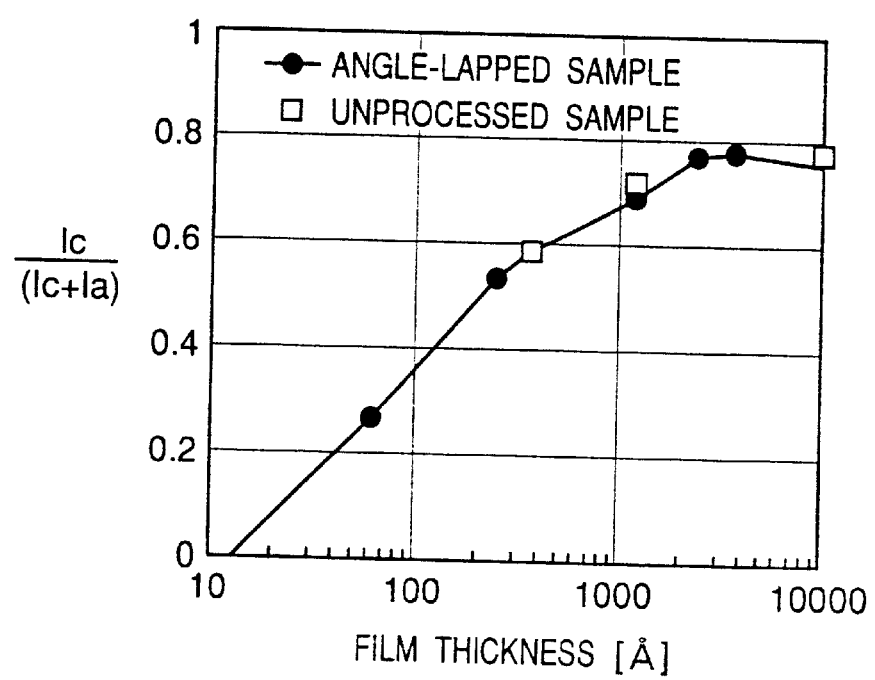
FIG. 2 is a graph showing a comparison of measurement results between a angle-lapping Raman scattering spectrometry method and the normal Raman scattering spectrometry method.

A polysilicon thin film sample having a thickness of about 1 $\mu m$ formed by the plasma enhanced CVD method on a glass substrate was subjected to measurement at a varied film thickness x by the angle-lapping Raman scattering spectrometry method by means of the normal diode parallel plate plasma enhanced CVD system, and the resulting samples were compared with the measurement results of a plurality of polysilicon thin film samples having different film thicknesses according to the normal Raman scattering spectrometry method by which the samples underwent no lapping process. The results are shown in FIG. 2. The evaluation results at the different film thicknesses obtained by the angle-lapping Raman scattering spectrometry method and the evaluation results of the plurality of samples that have different film thicknesses and are obtained by the normal Raman scattering spectrometry method exhibit satisfactory coincidence. This fact indicates that the sample damage due to the mechanical lapping in performing the measurement by the aforementioned angle-lapping Raman scattering spectrometry method is so small that no influence is exerted on the measurement results and means that the angle-lapping Raman scattering spectrometry method is sufficiently reliable.

Reference is next made to the microscopic structures of the single layer of an intrinsic layer and the single layer of a doped layer in the case where the aforementioned angle-lapping Raman scattering spectrometry method is used as the evaluation method of the microscopic structure.

Figure 3:
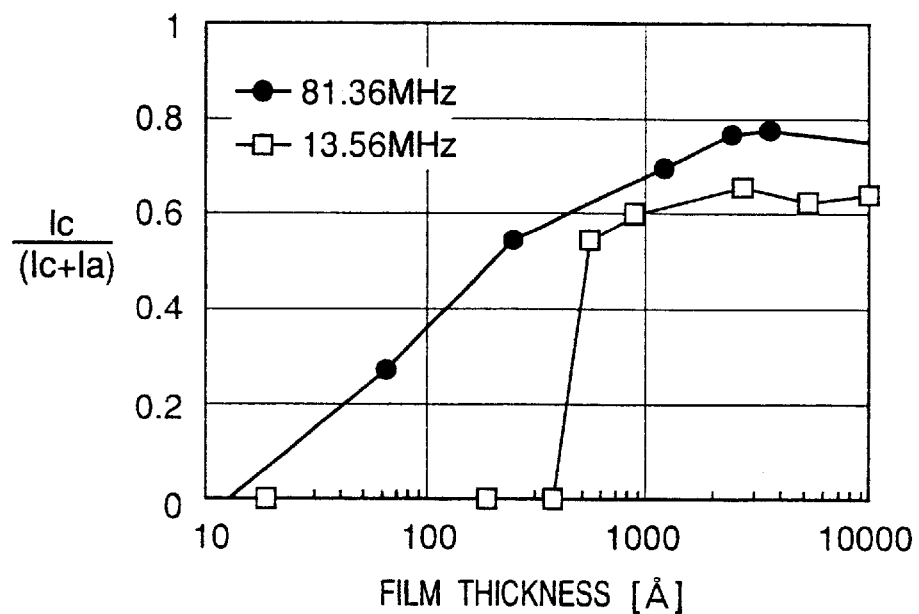
FIG. 3 is a graph showing measurement results of intrinsic thin film polysilicon samples formed at different plasma excitation frequencies according to the angle-lapping Raman scattering spectrometry method.

FIG. 3 shows the measurement results of two intrinsic thin film polysilicon samples that have been formed at different plasma excitation frequencies of 13.56 MHz and 81.36 MHz and measured by the angle-lapping Raman scattering spectrometry method by means of the normal diode parallel plate plasma enhanced CVD system. It is to be noted that these two samples have same film forming parameters (feed gas flow rate, substrate temperature, pressure, input power, etc.) other than frequency in order to clarify the effect of frequency.

In the case of the thin film polysilicon formed at the frequency of 13.56 MHz, the existence of no crystal component is observed from the start of film formation to a thickness of about 400 Å, and no remarkable increase of crystal component is observed even when the film thickness is subsequently increased. In contrast to this, in the case of the thin film polysilicon formed at the frequency of 81.36 MHz, a crystal component is generated immediately after the start of film formation, and saturation with a constant value occurs at a film thickness of about 3000 Å. Furthermore, the saturation value is greater than the saturation value in the case of the frequency of 13.56 MHz. This fact means that an intrinsic thin film polysilicon desirable for the application thereof to the photoelectric conversion layer of the thin film polysilicon solar cell having a sufficient amount of crystal components can be formed by forming the thin film polysilicon at the plasma excitation frequency higher than 13.56 MHz generally used for industrial applications.

Figure 4:
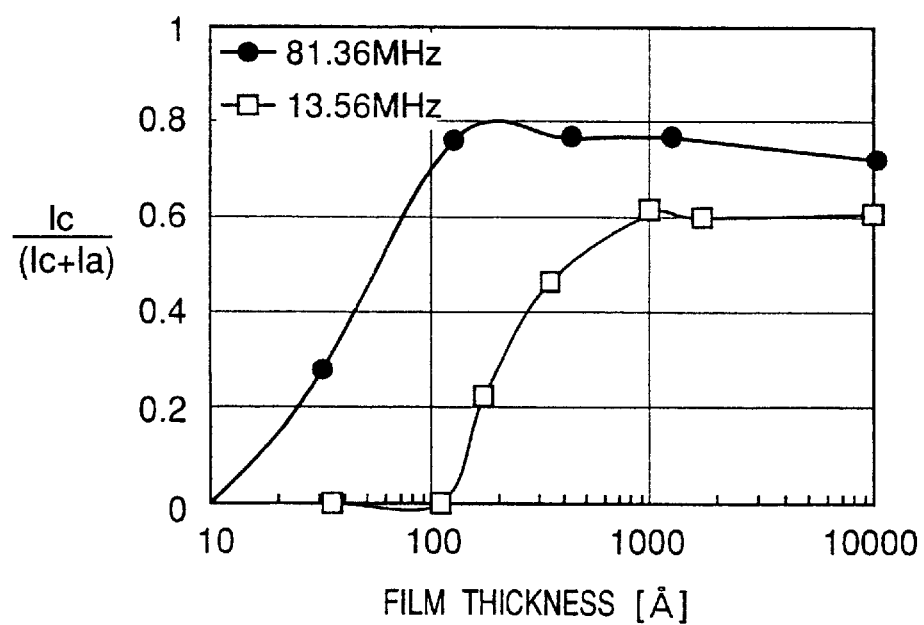
FIG. 4 is a graph showing measurement results of n-type thin film polysilicon samples formed at different plasma excitation frequencies according to the angle-lapping Raman scattering spectrometry method.

FIG. 4 shows the measurement results of two n-type thin film polysilicon samples that have been formed at different plasma excitation frequencies of 13.56 MHz and 81.36 MHz and measured by the angle-lapping Raman scattering spectrometry method using a dopant gas of $PH_3$ by means of the normal diode parallel plate plasma enhanced CVD system. It is to be noted that these two samples have same film forming parameters (feed gas flow rate, substrate temperature, pressure, input power, etc.) other than frequency in order to clarify the effect of frequency.

In the case of the n-type thin film polysilicon formed at the frequency of 13.56 MHz, the existence of no crystal component is observed from the start of film formation to a thickness of about 100 Å, and the crystal components increase as the film thickness increases. In contrast to this, in the case of the n-type thin film polysilicon formed at the frequency of 81.36 MHz, a crystal component is generated immediately after the start of film formation, and saturation with a constant value occurs at a film thickness of about 100 Å. Furthermore, the saturation value is greater than the saturation value in the case of the frequency of 13.56 MHz. This fact means that an n-type thin film polysilicon thin film desirable for the application thereof to the doped layer of the thin film polysilicon solar cell having a sufficient amount of crystal components can be formed even in a state in which the film thickness has a very small value of about 100 Å by forming the n-type thin film polysilicon at the plasma excitation frequency higher than 13.56 MHz generally used for industrial applications, also regarding the n-layer.

Figure 5:
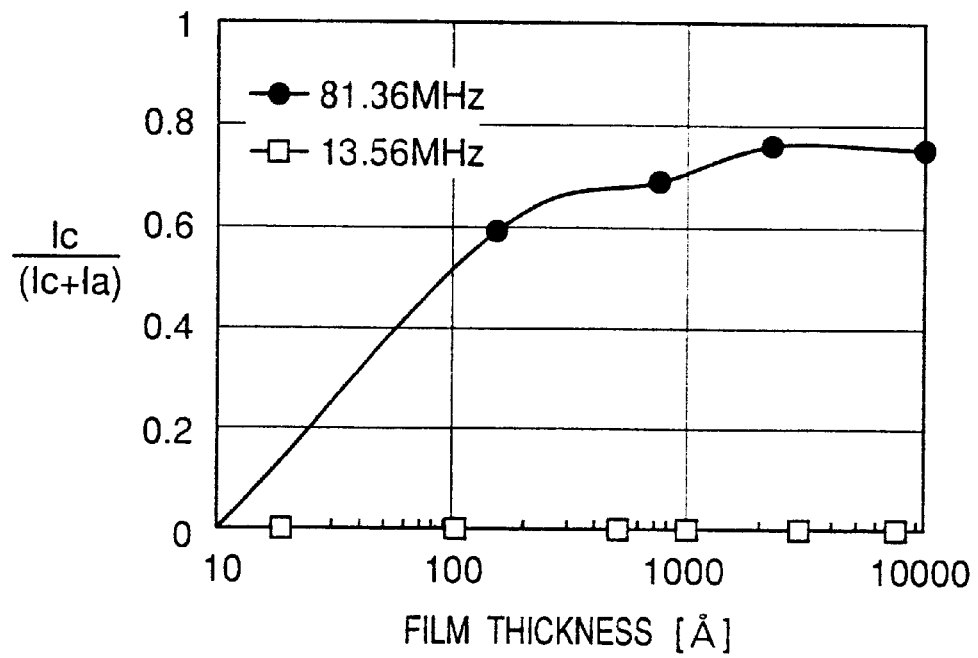
FIG. 5 is a graph showing measurement results of p-type thin film polysilicon samples formed at different plasma excitation frequencies according to the angle-lapping Raman scattering spectrometry method.

If the dopant gas is changed from $PH_3$ to $B_2H_6$, then the effect of the plasma excitation frequency appears more significantly. FIG. 5 shows the measurement results of two p-type thin film polysilicon samples that have been formed at different plasma excitation frequencies of 13.56 MHz and 81.36 MHz and measured by the angle-lapping Raman scattering spectrometry method using a dopant gas of $B_2H_6$ by means of the normal diode parallel plate plasma enhanced CVD system. It is to be noted that these two samples have same film forming parameters (feed gas flow rate, substrate temperature, pressure, input power, etc.) other than frequency in order to clarify the effect of frequency.

In the case of the p-type thin film polysilicon -formed at the frequency of 13.56 MHz, the existence of no crystal component is observed throughout the entire film thickness from the start of film formation to a thickness of about 10000 Å. In contrast to this, in the case of the p-type thin film polysilicon formed at the frequency of 81.36 MHz, a crystal component is generated immediately after the start of film formation, and saturation with a constant value occurs at a film thickness of about 100 Å, similarly to the case of the n-layer. That is, regarding the doped layer, the effect of the plasma excitation frequency higher than 13.56 MHz can be utilized in either conductive type without being limited to the n-type or the p-type.

Reference is next made to the photovoltaic conversion efficiency of the thin film polysilicon solar cell that employs a silicon thin film formed at the plasma excitation frequency of 13.56 MHz, as described hereinabove.

In fabricating the actual thin film polysilicon solar cell, it is important to determine the formation conditions of each layer so that the structure of the junction interface between the doped layer of a thickness of several hundred angstroms and the intrinsic layer formed on the doped layer becomes an appropriate structure. Accordingly, in the present embodiment, a change in the photovoltaic conversion efficiency of the solar cell fabricated by employing an intrinsic thin film polysilicon that is formed at the plasma excitation frequency of 81.36 MHz and has a higher crystallization ratio in a bulk state with a saturated crystallization ratio as an intrinsic photoelectric conversion layer and varying the formation conditions of the doped layer.

Figure 6:
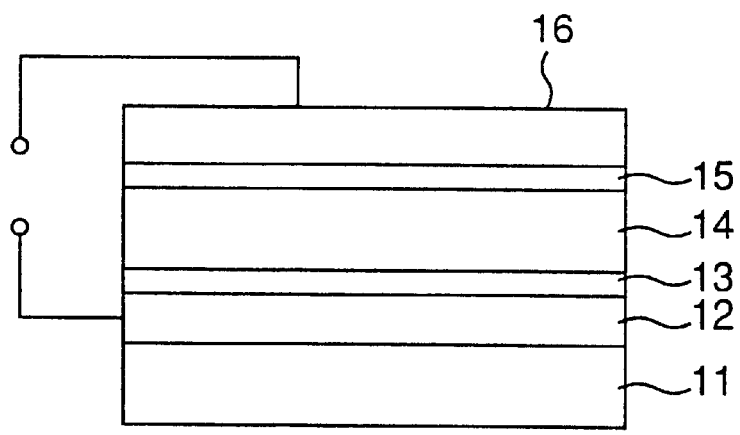
FIG. 6 is a diagram showing a device structure of the thin film solar cell of the present invention.

The device structure of the thin film solar cell of the present embodiment is now described with reference to FIG. 6. An n-type polysilicon thin film polysilicon layer 13, an intrinsic thin film polysilicon layer 14 and a p-type thin film polysilicon layer 15 are successively formed by the plasma enhanced CVD method on a transparent conductive film 12 of a glass substrate 11 stacked with the transparent conductive film ($SnO_2$ film) 12. Among the film formation parameters of the above-mentioned thin film polysilicon layers, the film formation parameters other than the plasma excitation frequency and the film thickness are the same as in forming the single layer film formed when evaluating the microscopic structure of the aforementioned single layer.

The intrinsic thin film polysilicon layer 14 is formed at a plasma excitation frequency of 81.36 MHz and has a film thickness of about 1 $\mu$m. The p-type thin film polysilicon layer 15 is formed at a plasma excitation frequency of 81.36 MHz and has a film thickness of about 100 Å. The plasma excitation frequency and the film thickness of the n-type thin film polysilicon layer 13 will be described later. Although the $SnO_2$ film is employed as the transparent conductive film in the present embodiment, the present invention is not limited to this. It is acceptable to employ an ITO (Indium Tin Oxide) film, a ZnO film or the like. Each film may be stacked several times.

Subsequently, a rear surface electrode 16 was formed of Ag to a film thickness of about 5000 Å by the electron beam vapor deposition method, for the fabrication of a solar cell. The photovoltaic conversion efficiency of this solar cell device was measured by applying a pseudo-sunlight of AM 1.5 and 100 mW/cm$^2$ to the glass substrate 11.

In the present embodiment, the n-type thin film polysilicon layer 13 was fabricated on the two conditions of:

Condition (1) of a plasma excitation requency of 81.36 MHz and a film thickness of 200 Å, and Condition (2) of a plasma excitation frequency of 13.56 MHz and a film thickness of 200 Å. In contrast to the ratio Ic/(Ic+Ia) of about 0.75 of the intrinsic layer in the bulk state according to the angle-lapping Raman scattering spectrometry method, the ratio Ic/(Ic+Ia) of the n-layer that had a film thickness of 200 Å and was formed on Condition (1) was about 0.75, which was approximately equal to the ratio Ic/(Ic+Ia) of the intrinsic layer In the bulk state. In this case, it was discovered that the intrinsic thin film polysilicon layer (intrinsic layer) 14 formed on the n-type thin film polysilicon layer (n-layer) 13 had the ratio Ic/(Ic+Ia) of 0.75 from the start of formation. That is, it can be said that a junction interface structure, which is appropriate for the solar cell and in which the amorphous component does not increase in a direction from the intrinsic layer 14 to the n-layer 13, is formed.

On the other hand, the ratio Ic/(Ic+Ia) of the n-layer that has a film thickness of 200 Å and has been formed on Condition (2) is about 0.25, which is much smaller than the ratio Ic/(Ic+Ia) of the intrinsic layer in the bulk state. In this case, the film formation of the intrinsic layer starts from the state in which the ratio Ic/(Ic+Ia) is 0.25 (n-layer), and the ratio Ic/(Ic+Ia) increases as the film thickness of the intrinsic layer increases. If a total film thickness of the n-layer and the intrinsic layer finally reaches about 1000 Å, then the ratio Ic/(Ic+Ia) becomes 0.75 in the bulk state. That is, the amorphous component increases in a direction from the intrinsic layer toward the n-layer, and a junction interface structure inappropriate for the solar cell is formed.

FIG. 7 shows he values of photovoltaic conversion efficiency, open-circuit voltage, shortcircuit current and fill factor of the thin film solar cell fabricated on the aforementioned Condition (1) and Condition (2). The formation conditions of the intrinsic layer and the p-layer are same, and therefore, the shortcircuit current values are approximately same. In contrast to this, the values of the open-circuit voltage and the fill factor of the thin film solar cell fabricated on Condition (1) are superior to those values of the thin film solar cell fabricated on Condition (2). These experimental facts indicated that a thin film solar cell of which the structure of the junction interface between the n-layer and the intrinsic layer is appropriate could be fabricated on the basis of the microscopic structure evaluation of the thin film polysilicon according to the angle-lapping Raman scattering spectrometry method.

As described above, in the present embodiment, the n-type polysilicon thin film layer 13, the intrinsic polysilicon thin film layer 14 and the p-type polysilicon thin film layer 15 are formed as a photoelectric conversion layer on the transparent conductive film 12 of the glass substrate 11 provided with the transparent conductive film 12 by the plasma enhanced CVD method at a plasma excitation frequency of 81.36 MHz. The n-layer and the intrinsic layer are thus formed so that the crystallization ratio of the n-type polysilicon thin film layer 13 becomes equal to or greater than the crystallization ratio of the intrinsic polysilicon thin film layer 14.

As an index of the crystallization ratio in the above case, the following values are used. That is, by the "angle-lapping Raman scattering spectrometry method" for performing Raman scattering spectrometry while successively changing the measurement position x in the direction of the formation of the slope with the polysilicon thin film provided with a minute angle α, the height Ic of the Raman scattering spectrum peak of about 520 cm$^{-1}$ corresponding to the crystal silicon and the height Ia of the Raman scattering spectrum peak of about 480 cm$^{-1}$ corresponding to the amorphous silicon are obtained. Then, the ratio Ic/(Ic+Ia) is adopted as the crystallization ratio.

With the above arrangement, the film formation conditions of the polysilicon thin film can be determined not by the information averaged in the direction of film thickness but by the crystallization ratio based on the continuous change of the microscopic structure in the direction of thickness. Therefore, by forming the polysilicon films of the doped layer and the intrinsic layer according to the thus determined film formation conditions, a thin film solar cell that has an appropriate junction interface structure in which the crystallization ratio of the doped layer is equal to or greater than the crystallization ratio of the intrinsic layer and has a satisfactory photovoltaic conversion efficiency can be obtained.

It is to be noted that the formation conditions (for example, the frequency of 81.36 MHz and the film thickness of 200 Å) of the doped layer and the intrinsic layer in the present embodiment may not be optimized for the solar cell. If the formation conditions of the layers are is optimized for the solar cell, then it is apparent that the photovoltaic conversion efficiency is further increased. The structure of the thin film solar cell fabricated in the above embodiment, in which the incident light side is located on the firstly formed n-type thin film polysilicon layer 13, as shown in FIG. 6. However, the present invention is not limited to this, and it is acceptable to provide a structure in which the incident light side is located on the thirdly formed p-type thin film polysilicon layer 15 that has a crystallization ratio equal to (or permitted to be greater than) the crystallization ratio of the intrinsic thin film polysilicon layer 14. The same effect can also be obtained when the p-type thin film polysilicon layer is firstly formed and located on the incident light side. Furthermore, it is a matter of course that a similar effect can be obtained even in the case of a stack type solar cell provided with a plurality of pin stack structures or nip stack structures.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A thin film solar cell comprising:
  a substrate supporting a p-type doped layer, an intrinsic photoelectric conversion layer and an n-type doped layer stacked on the substrate in this order or in order of the n-type doped layer, the intrinsic photoelectric conversion layer and the p-type doped layer,
  wherein at least the intrinsic photoelectric conversion layer formed secondly and the doped layer formed thirdly are silicon thin films including crystal components, the intrinsic photoelectric conversion layer formed secondly being provided between the substrate and the doped layer formed thirdly,
  the thirdly formed doped layer having a crystallization ratio being greater than a crystallization ratio of the secondly formed intrinsic photoelectric conversion layer.

2. The solar cell of claim 1, wherein:

the doped layer formed firstly comprises a silicon thin film including crystal components, said doped layer formed firstly being provided between the substrate and the intrinsic photoelectric conversion layer formed secondly, and the firstly formed doped layer has a crystallization ratio equal to or greater than the crystallization ratio of the secondly formed intrinsic photoelectric conversion layer.

3. The solar cell of claim 1, further comprising a conductive film provided between the substrate and the doped layer formed firstly.

4. A thin film solar cell as claimed in claim 1, wherein light enters from the thirdly formed doped layer.

5. A method of making a thin film solar cell comprising:

providing a p-type doped layer, an intrinsic photoelectric conversion layer and an n-type doped layer stacked in this order or in the order of the n-type doped layer, the intrinsic photoelectric conversion layer and the p-type doped layer, and wherein at least the intrinsic photoelectric conversion layer formed secondly and the doped layer formed thirdly comprise silicon thin films including crystal components, and forming the thirdly formed doped layer by a plasma enhanced chemical vapor deposition method using a VHF frequency band higher than a frequency of 13.56 MHz so that a crystallization ratio of the thirdly formed doped layer is greater than that of the secondly formed intrinsic photoelectric conversion layer.

6. A thin film solar cell comprising:

a substrate supporting a p-type doped layer, an intrinsic photoelectric conversion layer and an n-type doped layer stacked on the substrate in this order or in order of the n-type doped layer, the intrinsic photoelectric conversion layer and the p-type doped layer, wherein at least the doped layer formed firstly and the intrinsic photoelectric conversion layer formed secondly are silicon thin films including crystal components, said doped layer formed firstly being provided between the substrate and the intrinsic photoelectric conversion layer formed secondly, and the first formed doped layer having a crystallization ratio greater than a crystallization ratio of the secondly formed intrinsic photoelectric conversion layer, and the thirdly formed doped layer having a crystallization ratio greater than a crystallization ratio of the secondly formed intrinsic photoelectric conversion layer.

7. The solar cell of claim 6, further comprising a conductive film provided between the substrate and the first formed doped layer.

* * * * *